United States Patent [19]

Hitotsuyanagi et al.

[11] Patent Number: 5,086,037
[45] Date of Patent: Feb. 4, 1992

[54] CERAMIC SUPERCONDUCTING MEMBER

[75] Inventors: Hajime Hitotsuyanagi; Kazuo Sawada; Satoshi Takano; Shinji Inazawa, all of Osaka, Japan

[73] Assignee: Sumitomo Electric Industries, Ltd., Osaka, Japan

[21] Appl. No.: 180,495

[22] Filed: Apr. 12, 1988

[30] Foreign Application Priority Data

Apr. 14, 1987 [JP] Japan .................................. 62-91722

[51] Int. Cl.$^5$ .............................................. B32B 9/00
[52] U.S. Cl. .......................................... 505/1; 505/701; 505/702; 505/703; 505/704; 428/76; 428/426; 428/432; 428/688; 428/689; 428/698; 428/702; 428/704

[58] Field of Search .................. 505/1, 701, 811–813, 505/702, 704; 428/426, 432, 688, 689, 698, 702, 704, 76

[56] References Cited

FOREIGN PATENT DOCUMENTS 2483848 12/1981 France .
0117643 9/1981 Japan .
1499507 2/1978 United Kingdom .

*Primary Examiner*—Patrick J. Ryan
*Attorney, Agent, or Firm*—Pennie & Edmonds

[57] ABSTRACT

A ceramic superconducting member comprises a base material composed of a ceramic superconductive material such as $Y_{1.0}Ba_{2.0}Cu_{3.0}O_{7-x}$, and a protective layer of a ceramic material such as MgO formed on the surface of the tape-like base material.

2 Claims, 1 Drawing Sheet

CERAMIC SUPERCONDUCTING MEMBER

BACKGROUND OF THE INVENTION

1. Field of the Invention

The present invention relates to a ceramic superconducting member, and more particularly, it relates to a ceramic superconducting member which is applied to a cable, a device or the like employing a ceramic superconductive material.

2. Description of the Prior Art

It has recently been found with great interest that certain ceramic superconductive materials superconduct at high critical temperatures. Such a ceramic superconductive material is generally manufactured for experimental purposes by compression-molding a raw material through press working and thereafter sintering the same, to employ the same in the form of a ceramic pellet.

It has been provided that, for example, a superconductive material of Y-Ba-Cu-O has a critical temperature of at least 90 K.

In order to put such a ceramic superconductive material into practice, however, it is necessary to cool the same to a temperature lower than the normal temperature. Thus, a cooling medium such as liquid nitrogen is employed. For example, a device formed by a member of a ceramic superconductive material is used under presence of a cooling medium in order to effectuate its superconductivity, while the member is placed under the normal temperature when the same is not used. Thus, the member is repeatedly subjected to a number of heat cycles in environment having temperature difference for superconduction and non-superconduction under a low temperature and the normal temperature. Therefore, water vapor contained in the atmospheric air may be condensed by such temperature difference, to bedew the surface of the member with water droplets. It is assumed that, even if such a ceramic superconductive material is discovered which can superconduct at normal temperature in the future, the surface thereof may be bedewed with water droplets by water vapor contained in the atmospheric air, depending on environment.

SUMMARY OF THE INVENTION

The inventors have recognized that the aforementioned ceramic superconductive materials are so hygroscopic that the same is easily affected by moisture, and its critical temperature of superconduction is reduced by moisture absorption. When the surface of the ceramic superconducting member is bedewed with water droplets as hereinabove described, therefore, its superconductivity is reduced by permeation of water through the surface. However, the mechanism of degradation of such a ceramic superconducting member by moisture absorption has not yet been studied in the existing circumstances.

An object of the present invention is to provide a ceramic superconducting member comprising a ceramic superconductor, which has been proved to superconduct at a high critical temperature, to be capable of withstanding moisture change in environment and maintaining a high critical temperature.

In order to attain the aforementioned object, the ceramic superconducting member according to the present invention comprises a ceramic superconductor, the surface of which is coated with a ceramic protective layer having moisture resistance and air tightness.

The ceramic superconductive material is in composition generally expressed in a formula AaBbCc, where a, b and c represent numbers showing the composition ratio of A, B and C. A represents at least a single sort of element selected from a group of those belonging to the groups Ia, IIa and IIIa of the periodic table, B represents at least a single sort of element selected from a group of these belonging to the groups Ib, IIb and IIIb of the periodic table, and C represents at least a single sort of element selected from the group of oxygen, carbon, nitrogen, fluorine and sulfur. In such composition, A preferably contains two or more elements selected from the group of those belonging to the groups, Ia, IIa and IIIa of the periodic table. Further, B preferably contains at least copper and C preferably contains at least oxygen.

The elements belonging to the group Ia of the periodic table are H, Li, Na, K, Rb, Cs and Fr. The elements belonging to the group IIa of the periodic table are Be, Mg, Ca, Sr, Ba and Ra. The elements belonging to the group IIIa of the periodic table are Sc, Y, La, Ce, Pr, Nd, Pm, Sm, Eu, Gd, Tb, Dy, Ho, Er, Tm, Yb, Lu, Ac, Th, Pa, U, Np, Pu, Am, Cm, Bk, Cf, Es, Fm, Md, No and Lr.

The elements belonging to the group Ib of the periodic table are Cu, Ag and Au. The elements belonging to the group IIb of the periodic table are Zn, Cd and Hg. The elements belonging to the group IIIb of the periodic table are B, Al, Ga, In and Tl.

Preferably, the ceramic protective layer may be prepared of one or more compounds such as nitrides, oxides, a borides and a carbides of at least a one or more elements selected from groups IIa, IIIa, IIIb, IVa and IVb of the periodic table.

Further, the protective layer may be prepared by heating a gel generated by hydrolysis nd polycondensation of a metal alkoxide.

According to the present invention, the moisture-resistant and air-tight protective layer covering the surface of the ceramic superconductor is prepared of a ceramic compound, to adhere well to a superconductive ceramic compound forming a base material. Further, there is absolutely or substantially no difference in thermal expansion coefficient between such a protective layer and the superconductive ceramic compound forming the base material. Therefore, the surface of the superconducting member is preventing from permeation of water under environment repeating the aforementioned heat cycles, while adhesion thereof is not damaged. Consequently, a highly reliable ceramic superconducting member can be attained which is resistant to degradation caused by changes in the ambient moisture content.

These and other objects, features, aspects and advantages of the present invention will become more apparent from the following detailed description of the present invention when taken in conjunction with the accompanying drawings.

DESCRIPTION OF THE PREFERRED EMBODIMENTS

Example 1

The surface of a tape-like member composed of $YBa_2Cu_3O_{7-x}$, being a ceramic superconductive material having critical temperatures (superconductivity transition start temperature: $T_{CO}=90$ K; superconductivity transition end temperature: $T_{Ci}=88$ K) exceeding the boiling point of liquid nitrogen, was coated with a protective film of AlSiON of 3 μm in thickness by double-pole RF magnetron sputtering. A target of $SiO_2+Al$ and a gas of $Ar+20\%N_2$ were employed for such sputtering, with gas pressure of 60 mTorr. and output of 400 W. The base material was cooled at this time.

Figure 1:
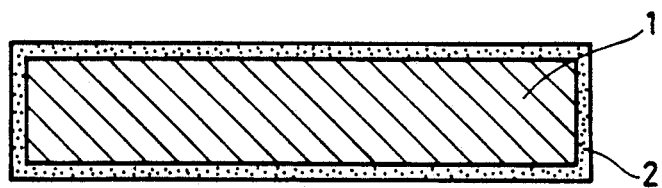
FIGS. 1 and 2 illustrate embodiments of a ceramic superconducting member coated with a ceramic protective layer according to the present invention.

FIG. 1 shows a superconductor having a protective layer thus obtained. A protective layer 2 of AlSiON is formed on the outer surface of a tape-like ceramic superconductor 1.

For the purpose of comparison, a sample having no protective film and a sample provided with a protective film obtained in the aforementioned manner were subjected to a heat cycle test of alternately holding the same in a liquid nitrogen atmosphere and an atmosphere of 35° C. in temperature and 100% in relative humidity respectively for one hour, by ten cycles. As the result, the sample having no protective film was affected by moisture, whereby the superconductivity transition start temperature: $T_{CO}$ and the superconductivity transition end temperature: $T_{Ci}$ were changed to 86 K and 16 K respectively to cause no superconducting phenomenon at the temperature of liquid nitrogen. In the sample provided with the protective film, no change was caused in the superconductivity transition start temperature: $T_{CO}$ and the superconductivity transition end temperature: $T_{Ci}$ after the same heat cycles.

Example 2

A film of $Y_{1.0}Ba_{2.0}Cu_{3.0}O_{7-x}$, being a ceramic superconductive material superconducting at a critical temperature exceeding the boiling point of liquid nitrogen, was formed on a sapphire substrate. Further, a protective film of AlSiN was formed thereon in thickness of 3 μm by double-pole RF magnetron sputtering. A target of AlSi and a gas of $Ar+20\%N_2$ were employed for sputtering, with gas pressure of 20 mTorr. and output of 200 W. The substrate was cooled.

Figure 2:
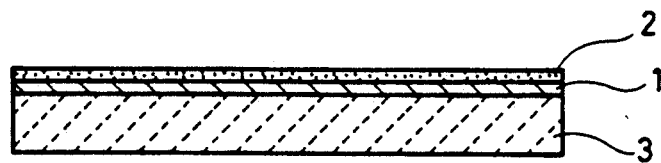

FIG. 2 shows a superconductor having a ceramic protective layer thus obtained. A ceramic superconductor 1 was formed on a sapphire substrate 3, and a protective layer 2 of AlSiN was formed further thereon.

This Example was subjected to a comparison test with a sample having no protective film similarly to Example 1, whereby a result similar to that of Example 1 was attained.

Example 3

An $Y_{1.0}Ba_{2.0}Cu_{3.0}O_{7-x}$ film was coated with an $Al_2O_3$ solution by rotating the substrate at 2000 r.p.m. and dripping the $Al_2O_3$ solution onto the rotating substrate. This was then heated at 800° C. for 10 minutes. Thus, an $Al_2O_3$ film of 1.5 μm in thickness was formed on the surface of a ceramic superconductor.

The $Al_2O_3$ coating solution was prepared as follows: Water of 25 mol was added to aluminum isobutoxide $[(sec-C_4H_9O)_3Al]$ of 0.5 mol at the room temperature, to be then heated at 100° C. for one hour. Thereafter nitric acid of 0.5 mol was further added to be heated at 100° C. for one hour. Finally this solution was distilled at 100° C. to be reduced to ⅔ in weight through elimination of solution components, thereby to obtain the coating solution.

A heat cycle test was performed on this superconductor and a sample having no protective film for the purpose of comparison, similarly to Example 1. A result similar to that in Example 1 was obtained.

Example 4

A protective film of MgO was formed in thickness of 3 μm on the surface of a tape-like member of $Y_{1.0}Ba_{2.0}Cu_{3.0}O_{7-x}$, being a ceramic superconductive material having critical temperatures (superconductivity transition start temperature: $T_{CO}=90$ K; superconductivity transition end temperature: $T_{Ci}=88$ K) exceeding the boiling point of liquid nitrogen, through RF magnetron sputtering. The sputtering step was performed by employing a target of polycrystal magnesium oxide and Ar gas, with gas pressure of 10 mTorr. and output of 100 W. FIG. 2 shows a superconductor having a protective layer thus obtained. A ceramic superconductor 1 was formed on a sapphire substrate 3, and a protective layer 2 of MgO was formed further on the same. This superconductor 1 was subjected to a comparison test with a sample having no protective film similarly to Example 1, whereby a result similar to that in Example 1 was obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ceramic superconducting member, comprising:
    a base material having a main surface and comprising a ceramic superconductive material; and
    a continuous protective layer formed at least over said main surface of said base material and encapsulating said ceramic superconducting material; said protective layer comprising a ceramic material having a coefficient of thermal expansion about the same as said ceramic superconducting material and resistant to moisture, wherein
    said ceramic superconductive material is of a composition generally expressed by the formula AaBbCc,
    where a, b, and c represent numbers showing the composition ratio of A, B and C, respectively,
    where the composition ratio of a:b:c=3:3:7−x (0<x<7),
    where A contains yttrium and barium B contains copper and C contains oxygen, and
    wherein said ceramic material of said continuous protective layer is selected from nitrides, oxides, and oxynitrides of at least one element selected from groups IIa, IIIa, IIIb, IVa and IVb of the periodic table.

2. A ceramic superconducting member in accordance with claim 1, wherein
    said ceramic protective layer is formed by heating a gel generated by hydrolysis and polycondensation of a metal alkoxide.

* * * * *